United States Patent [19]

Hartmann et al.

[11] 4,011,084
[45] Mar. 8, 1977

[54] FLUID PHOTO-CROSSLINKABLE COMPOSITIONS FOR THE MANUFACTURE OF RELIEF PRINTING PLATES

[75] Inventors: Heinrich Hartmann, Limburgerhof; Gerhard Hoffmann, Speyer; Helmut Barzynski, Bad Durkheim; August Lehner, Roedersheim-Gronau; Werner Lenz, Ludwigshafen; Herbert Stutz, Karlsruhe; Heinz-Ulrich Werther, Ludwigshafen, all of Germany

[73] Assignee: BASF Aktiengesellschaft, Ludwigshafen (Rhine), Germany

[22] Filed: Sept. 10, 1975

[21] Appl. No.: 612,010

[30] Foreign Application Priority Data

Sept. 13, 1974 Germany .................. 2443786

[52] U.S. Cl. .................... 96/115 P; 96/115 R; 96/86 P; 96/35.1; 204/159.19
[51] Int. Cl.² .................... G03C 1/68
[58] Field of Search ............ 96/35.1, 115 R, 115 P; 204/159.15, 159.19

[56] References Cited

FOREIGN PATENTS OR APPLICATIONS 2,115,373  10/1971  Germany

Primary Examiner—John D. Welsh
Attorney, Agent, or Firm—Johnston, Keil, Thompson & Shurtleff

[57] ABSTRACT

Fluid photo-crosslinkable composition consisting essentially of a photo-initiator and a mixture of A. a polyurethane obtained by reacting a hydroxyl-containing saturated aliphatic polyester with a polyisocyanate and a monoacrylate or monomethacrylate of a diol, and B. an N-vinyl lactam optionally in admixture with other monomers.

These compositions are suitable for the production of high-quality relief printing plates and have a short processing time.

8 Claims, No Drawings

FLUID PHOTO-CROSSLINKABLE COMPOSITIONS FOR THE MANUFACTURE OF RELIEF PRINTING PLATES

The present invention relates to a fluid, photo-crosslinkable composition for the manufacture of relief printing plates, which consists essentially of a photoinitiator and a mixture of an olefinically unsaturated urethane resin and polymerizable monomers, and wherein the resin is a particular unsaturated polyester-polyurethane resin and the monomer is an N-vinyl-lactam.

Fluid compositions for negative-working printing plates have been disclosed. These materials are mixtures of one or more macromolecular compounds and photopolymerizable olefinically unsaturated monomers or mixtures of such monomers, which after exposure or irradiation become insoluble in solvents in which they are soluble before exposure. A fairly comprehensive list of the materials used is given, e.g., by J. Kosar, "Light Sensitive Systems", John Wiley & Sons, New York, 1967.

It is a disadvantage of conventional fluid compositions for the manufacture of relief printing plates and letterpress plates in particular that they tend to crosslink only relatively slowly, and do not exhibit tack-free surfaces, in the presence of atmospheric oxygen. To prevent this, it is either necessary to resort to the expensive measure of carrying out the imagewise exposure under an oxygen-free atmosphere, for example in an atmosphere of nitrogen or carbon dioxide, or to carry out the image-wise exposure through an oxygen-impermeable layer which transmits actinic light and is in intimate contact with the polymer.

It has therefore been proposed to use, for the manufacture of flexible plates for flexographic printing, a photo-crosslinkable composition which contains a polyurethane prepolymer, a photosensitizer and, if desired, a photopolymerizable olefinically unsaturated monomer, the polyurethane prepolymer having been manufactured by reaction of a hydroxylic component which possesses at least 5 ether bonds and an olefinically unsaturated double bond at the end groups, with a polyisocyanate component (German Published Application (DOS) No. 2,115,373). However, the proposed composition has the disadvantage that the printing plates produced therefrom have a relatively low hardness (Shore A $\leq$ 93). They are therefore only suitable for flexographic printing and not for conventional letterpress printing in which high printing pressures are used. Further disadvantages of the composition are the relatively long exposure time required and the residual tackiness of the exposed surfaces.

It is an object of the present invention to provide a fluid, photo-crosslinkable composition for the manufacture of relief printing plates and especially of relief printing plates suitable for letterpress printing, which substantially meets the following requirements:

1. Even in the presence of air, image-wise exposure of the compositions should give completely tack-free surfaces, as a result of which subsequent post-exposure of the crosslinked areas forming the relief image or the expensive equipment for carrying out the exposure in the absence of oxygen can be dispensed with.

2. The requisite exposure time of the compositions should be as brief as possible in order to achieve short cycle times for the manufacture of the finished printing plate, such as are above all demanded in newspaper printing.

3. The relief printing plates obtained should have Shore D hardnesses $\geq$ 65 so as to give very little or no shift in the tonal values at the high printing pressures encountered in conventional letterpress printing. At the same time, however, the crosslinked areas of the printing plate should not be brittle in order to prevent individual dots or halftone dots from splintering or being broken off at their bases and to prevent other sensitive parts of the relief image of the printing plate from being damaged.

4. The relief printing plates obtained should be sufficiently hard at temperatures of up to about 80° C to permit the production of mats by pressing suitable flong material against the plate, as is customary in newspaper printing. Several duplicates of the printing plate, which faithfully render all details of the original relief image, can then be obtained by casting conventional metal alloys in the mat.

5. The conventionally used printing inks should transfer well from the relief printing plates to the print stock without the printing plates swelling and thereby giving an inferior print.

We have found that fluid mixtures, containing a photo-initiator, of a particular unsaturated polymer, as characterized in more detail below, and of a N-vinyl-lactam or of a monomer mixture containing a N-vinyl-lactam are particularly suitable for the manufacture of relief printing plates, especially for letterpress printing, and substantially exhibit the desired properties when used in accordance with the invention.

Accordingly, the invention relates to fluid, photo-crosslinkable compositions for the manufacture of relief printing plates, which consist essentially of a photo-initiator and a fluid mixture of A. an unsaturated polymer and B. a photopolymerizable monomer with one or more olefinically unsaturated double bonds or a mixture of such monomers, wherein the fluid mixture consists of:

A. from 40 to 80, and especially from 40 to 70, percent by weight of a soluble, olefinically unsaturated polyurethane which is virtually free from NCO groups and has a molecular weight of from about 400 to 10,000, and especially from 1,000 to 5,000, which polyurethane has been manufactured by reaction of A1. one or more soluble saturated polyesters obtained from (a1) polyhydric aliphatic alcohols of 2 to 8 carbon atoms, and especially diols and triols of 2 to 6 carbon atoms, and (a2) dicarboxylic acids of 4 to 8 carbon atoms, of which at least 50 mole percent are saturated aliphatic compounds, or thier esterforming derivatives, the polyester (A1) having a mean molecular weight of from preferably 500 to 5,000 especially from 500 to 3,000, with A2. an organic polyisocyanate of about 6 to 36, and preferably of 8 to 15, carbon atoms, and especially a diisocyanate, and A3. a monoacrylate and/or monomethacrylate of an aliphatic diol of 2 to 10, and especially of 2 to 4, carbon atoms, and B. from 20 to 60, and especially from 20 to 50, percent by weight of one or more photopolymerizable olefinically unsaturated monomers, provided that from 20 to 100, and especially from 30 to 100, percent by weight of the total amount of monomer (B) consists of an N-vinyl-lactam of 6 to 8, and especially of 6, carbon atoms.

The invention further relates to the use of the said compositions for the manufacture of relief printing plates, especially for direct letterpress printing, and to a process for the manufacture of relief printing plates by image-wise exposure of a layer of the said compositions applied for example to a plastics or metal base and subsequent removal of the unexposed areas of the layer, it being of course also possible to additionally carry out a conventional brief pre-exposure of the entire layer or post-exposure of the developed relief printing plate, even though this is unnecessary in many cases.

The olefinically unsaturated polyurethanes (A) can be manufactured by conventional methods, by reaction of the polyisocyanates (A2) with the hydroxyl-containing polyesters (A1) and hydroxyacrylates or hydroxydmethacrylates (A3), for which, in general, approximately equimolar amounts of NCO groups and OH groups are used. Of course it is for example also possible, using conventional methods, first to react the diol monoacrylate or monomethyacrylate (A3) with excess diisocyanate and thereafter to react the product, containing isocyanate groups, with the hydroxyl-containing polyether (A1), with or wihout the addition of further diisocyanate. The approximately simultaneous reaction of the components A1, A2 and A3 is preferred.

The reaction in which the polyester-urethanes are manufactured can be carried out in the absence of solvents. However, it can also be carried out in the presence of photo-polymerizable monomers (B), which at least in the main do not react with isocyanate groups under the reaction conditions, in which case the monomers function as "diluents". It has proved to be advantageous to carry out the reaction in the presence of N-vinylpyrrolidone. If the reaction is carried out in the presence of conventional organic solvents, which are inert to NCO groups under the reaction conditions, it is advantageous to distil off the solvents under reduced pressure after the reaction. Examples of suitable solvents are esters, such as ethyl acetate, and ethers, such as tetrahydrofuran.

The reaction is usually carried out at from about 40° to 80° C. Higher temperatures should as far as possible be avoided because of the risk of the reaction batch gelling. Conventional catalysts, such as tertiary amines or metal compounds, such as dibutyl-tin dilaurate, may be employed to accelerate the rate of reaction. The addition of conventional polymerization inhibitors, e.g. hydroquinone, methoxyphenol, hydroquinone monomethyl ether, p-quinone, copper(I) chloride, methylene blue, $\beta$-naphthylamine, $\beta$-naphthol, phenol or organic nitroso compounds is advantageous in some cases.

Suitable polyhydric aliphatic alcohols of 2 to 8 carbon atoms for the manufacture of the polyesters A1 are, in particular, aliphatic diols and mixtures of diols with triols, the amounts of which are determined mainly by the desired hydroxyl number of the resulting polyester A1 but also by the requirement that the resulting polyester A1 should be readily soluble in organic solvents. Examples of suitable polyhdric alcohols are ethylene glycol, propylene glycols, e.g. 1,2-propanediol, butanediols, hexanediols, e.g. 1,6-hexanediol, diethylene glycol, triethylene glycol, 1,1,1-trimethylolpropane, glycerol and 1,2,6-hexanetriol; of these, 1,2-propanediol, diethylene glycol and 1,1,1-trimethylolpropane are preferred. Examples of suitable dicarboxylic acids are succinic acid, adipic acid, phthalic acid and hexahydrophthalic acid. Adipic acid, and mixtures of from 50 to 99 mole percent of adipic acid and from 1 to 50 mole percent of phthalic acid, especially of from 70 to 95 mole percent of adipic acid and from 5 to 30 mole percent of phthalic acid, are preferred.

The polyesters A1 may be manufactured by conventional methods. For example, the acids or acid mixtures, together with the polyhydric alcohols, are progressively heated to from 200° to 220° C in an inert atmosphere at the rate at which water is eliminated, initially under atmospheric pressure and subsequently under reduced pressure. The esterification can also be carried out by adding an entrainer and conventional esterification catalysts.

Suitable orgainic polyisocyanates (A2) for the manufacture of the polyester-polyurethanes (A) are, e.g., 2,4-toluylenediisocyanate, 2,6-toluylenediisocyanate, 4,4'-diisocyanatodiphenylmethane, xylylenediisocyanate, 4,4'-diisocyanatodiphenylmethane, xylylenediisocyanate, 4,4'-pehnylcyclohexylmethanediisocyanate, 4,4'-dicyclohexylmethanediisocyanate, 2,2,4-trimethylhexamethylenediisocyanate, isophoronediisocyanate, hexamethylenediisocyanate, biurets based on, e.g., hexamethylenediisocyanate, and mixtures of polyisocyanates. Aliphatic diisocyanates, which are to be understood to include and cycloaliphatic diisocyanates, are preferred.

Examples of suitable monoesters of acrylic acid or methacrylic acid and an aliphatic diol (A3) are 1,4-butanediol monoacrylate, ethylene glycol monoacrylate, 2-hydroxypropyl acrylate and 2-hydroxypropyl methacrylate. Mixtures of such hydroxyl compounds (A3) can also be employed for the manufacture of the polyester-urethane (A). For example, diacrylates, dimethacrylates, triacrylates and trimethacrylates of aliphatic triols or tetraols may also be employed, e.g. 1,1,1-trimethylolpropane diacrylate and dimethacrylate, and pentaerythritol triacrylate and trimethacrylate. Monomers of the type of aromatic allyl compounds, e.g. diallyl phthalate, can also be used with advantage.

The photopolymerizable monomers or monomer mixtures contained in the compositions of the invention in addition to the unsaturated polyurethane (A) should contain at least 20, and preferably at least 30 percent, by weight of an N-vinyl-lactam, such as N-vinylcaprolactam or, in particular, N-vinylpyrrolidone. Compositions in which from more than 50 and especially from more than 70 to about 100 percent by weight of the monomer (B) consist of Nvinylpyrrolidone have proved very suiable. Particularly suitable comonomers are esters of acrylic acid and/or methacrylic acid, such as methylmethacrylate, n-butyl acrylate or methacrylate, 2-hydroxypropyl acrylate, 1,4-butanediol diacrylate and diethylene glycol dimethacrylate.

Minor amounts of amides of acrylic acid or methacrylic acid, such as acrylamide, N-methylolacrylamide or N-methylolmethacrylamide, are also suitable, provided the resulting mixtures remain fluid. Further examples of quite suitable monomers are vinyl ethers of aliphatic diols of 2 to 8 carbon atoms, such as 1,4-butanediol divinyl ether, and minor amounts of vinyl esters of aliphatic monocarboxylic acids, such as vinyl acetate and vinyl propionate. Of course it is also possible to use mixtures of photo-polymerizable monomers and to vary the type and amounts thereof so as to modify the properties of the compositions as desired, to suit certain applications. Advantageous monomers are the reaction products, free from isocyanate groups, of organic, preferably aliphatic, polyisocyanates, such as those mentioned above as components A2, with hydroxyl-containing acrylates or methacrylates, such as those mentioned above as component A3, e.g. the reaction products of 1 mole of isophoronediisocyanate and 2 moles of 1,4-butanediol monoacrylate or 1,2-propylene glycol monoacrylate. The use of compositions of the invention containing from 20 to 50 percent by weight of these monomers (based on total monomer) is particularly advantageous, and these monomers can also be manufactured during the production of the unsaturated polyurethanes, in the same reaction vessel. In particularly suitable compositions, the proportion of these monomers is from about 10 to 35 percent by weight of the amount of polyurethane.

To increase the photo-sensitivity of the compositions of the invention, photo-initiators, i.e. sensitizers, are also added, in the conventional way, in amounts of from about 0.1 to 10 percent by weight. Examples of such sensitizers are α-ketaldonyl alcohols, e.g. benzoin and α-substituted benzoin compounds, e.g. α-methylolbenzoin and α-methylolbenzoin ethers, α-methylbenzoin and α-phenylbenzoin. So-called triplet sensitizers, as described, e.g., by N. Turro, "Molecular Photochemistry", W. A. Benjamin, Inc., New York, 1967, page 132, may also be used.

Other conventional assistants and additives, e.g. polymerization inhibitors, plasticizers and/or dyes, may also be added to the compositions according to the invention but are not essential.

To manufacture laminates for the production of relief printing plates, a layer of the photo-crosslinkable compositions of the invention is applied, in the desired thickness, by conventional methods, e.g. by means of a doctor blade, to dimensionally stable substrates or bases, such as metal sheets or plastics films. If the layers are more than 30 μ thick, it is advisable to use an adhesion promoter, as described, e.g., in German Published Applications (DOS) Nos. 1,572,303 and 1,597,515.

Image-wise exposure of the laminates thus obtained through a photographic negative to actinic light, which may take up to several minutes depending on the power of the light source used, results in crosslinking of the exposed areas. To develop the plate, the unexposed and therefore non-crosslinked areas of the layer are removed, which may suitably be effected by means of a solvent (devloper) or mechanically, for example by means of compressed air and the subsequent application of absorbent materials. A method of mechanically removing the non-crosslinked areas of the layer (dry developing) is described, e.g., in Belgian Pat. No. 803,682.

Exposure may be carried out not only with high-energy lamps emitting a high proportion of UV light, e.g. carbon arc lamps, mercury vapor lamps, xenon lamps and fluorescent tubes, but also with light sources producing little UV radiation, e.g. fluoresent tubes emitting a high proportion of blue light.

The compositions of the invention and the process of the invention may be used for the manufacture of relief plates for letterpress printing as well as for dry offset printing (indirect letterpress). They have the advantage over conventional liquid systems for the manufacture of printing plates, that plates with relief images of great sharpness may be produced with very short exposure times. Even in the presence of air, printing plates with tack-free surfaces can be produced rapidly and, if they are exposed correctly, the resulting printing reliefs are sufficiently hard and nevertheless not brittle. Furthermore, they exhibit very good ink transfer properties and are swollen to only a very slight extent by printing inks. Moreover, the layer of the composition of the invention applied to the base generally does not have to be pre-exposed over its entire area, as is customary in the case of conventional liquid materials for printing plates. Post-exposure of the developed relief printing plate is advantageous in some cases, for example if the properties of the printing plates have to meet special requirements. In the case of dry developing, postexposure is advisable in order to cure any remains of resin which may not have been removed, and gives tack-free surfaces very quickly even in the presence of atmospheric oxygen, without there being any need to use special techniques.

The parts and percentages given in the following Examples and comparative experiments are by weight, unless stated otherwise.

EXAMPLE 1 a. A polyurethane (molecular weight about 1,500) was manufactured by reaction of 10 equivalents of hexamethylenediisocyanate, 3.5 equivalents of a polyester resin (A1) obtained from adipic acid and a minor amount of phthalic anhydride, and 1,2-propylene glycol and 1,1,1-trimethylolpropane, the polyester having an OH-number of about 165, and 7.5 equivalents of 2-hydroxypropyl acrylate. 75 parts of the product were mixed with 25 parts of N-vinylpyrrolidone, 1 part of benzoin methyl ether and 0.05 part of the potassium salt of N-nitrosocyclohexylhydroxylamine.

b. A metal ring of 15 cm internal diameter and 0.5 mm height is placed as spacer on a steel sheet measuring 20 × 20 cm and coated with an adhesion promoter according to German Pulished Application (DOS) No. 1,597,515. The resulting flat mold is filled with the above fluid photosensitive mixture and then covered with a 20 μ thick polyester film. The mixture is exposed through a halftone negative, placed on the polyester film, in a commercial exposure unit (Model: "Piccolo", manufactured by Fa. Moll, Solingen, Germany, and fitted with 8 Philips TLA 20 W/05 low-pressure fluorescent tubes). After pulling off the polyester film and washing out the unexposed areas with ethanol, small letterpress printing plates are obtained. As may be seen from the comparison of certain properties of the compositions and printing plates, in Table 1, hard tack-free plates which show little swelling in organic solvents used in printing inks are obtained.

EXAMPLE 2

The procedure followed is exactly as in Example 1 but in place of 25 parts of N-vinylpyrrolidone, 13.3 parts of N-vinylpyrrolidone, 9.3 parts of a mixture of 1-hydroxypropyl acrylate and 2-hydroxypropyl acrylate and 2.3 parts of acrylamide are used as photopolymerizable monomers.

The properties of the photocrosslinkable compositions and printing plates are shown in Table 1.

EXAMPLE 3

1 part of benzoin methyl ether and 0.05 part of the potassium salt of N-nitrosocyclohexylhydroxylamine are added, with mixing, to a mixture of 75 parts of a polyurethane (molecular weight about 1,300), which has been manufactured by reaction of 5.5 equivalents of isophoronediisocyanate, 2.4 equivalents of the polyester (A1) indicated in Example 1a, 1 equivalent of 1-hydroxyproyl methacrylate and 2.8 equivalents of 2-hydroxypropyl acrylate (in the presence of N-vinylpyrrolidone), and 25 parts of N-vinylpyrrolidone.

This composition was processed into printing plates as described in Example 1b. The properties of the composition and printing plates are shown in Table 1. The composition only needs a very short exposure time and the relief printing produced therefrom exhibit very little swelling in ethyl glycol acetate.

EXAMPLE 4

The procedure followed is exactly as in Example 3 except that in place of 25 parts of N-vinylpyrrolidone the fluid mixture contains 13.3 parts of N-vinylpyrrolidone, 9.3 parts of 2-hydroxypropyl acrylate and 2.3 parts of acrylamide. The properties of the photocrosslinkable composition and printing plates are shown in Table 1.

EXAMPLE 5

1 part of benzoin methyl ether and 0.05 part of the potassium salt of N-nitrosocyclohexylhydroxylamine are added, with mixing, to a mixture of 75 parts of a polyurethane (A) (molecular weight about 1,100), which has been manufactured by reaction of 3 equivalents of a polyester (A1), obtained from adipic acid and a minor amount of phthalic anhydride, and 1,2-propylene glycol and a minor amount of 1,1,1-trimethylolpropane, the polyester having an OH number of 220, with 8 equivalents of hexamethylenediisocyanate (A2) and 5 equivalents of 2-hydroxypropyl acrylate (A3), and 25 parts of N-vinylpyrrolidone (B).

This composition is processeed into printing plates as described in Example 1b). The properties of the composition and printing plates are given in Table 1.

The Table clearly shows the enormous increase in photosensitivity brought about by the use of N-vinylpyrrolidone as added monomer. The photo-crosslinking occurring at the surface of the layer is inhibited only slightly by the presence of oxygen. The sensitivity to organic solvents used in printing inks is particularly low if N-vinylpyrrolidone is used exclusively, as shown by the last column of Table 1.

COMPARATIVE EXPERIMENT A

A mixture of 90 parts of a prepolymer according to Examples 1 to 3 of German Published Applicaton (DOS) No. 2,115,373, manufactured from 2 moles of toluylenediisocyanate, 1 mole of a polyether-polyol of molecular weight 1,000 and 2.2 moles of hydroxy-ethyl acrylate, 10 parts of methyl methacrylate, 1 part of benzoin methyl ether and 0.015 part of p-benzoquinone, is processed into printing plates as described in Example 1. As may be seen from Table 1, the printing plates obtained have a tacky surface and swell markedly in organic solvents used in printing inks.

TABLE 1

Some properties of the photocrosslinkable compositions and printing plates of Examples 1 to 5 and Comparative Experiment A

| | Exposure time[a] mins | Surface tackiness[b] | Konig pendulum hardness (secs) | Swelling[c] in $H_2O$ (%) | Swelling[c] in EGAc (%) |
|---|---|---|---|---|---|
| Example 1 | 3.5 | tack-free | 49 | 10.6 | 14.9 |
| Example 2 | 5 | tack-free | 31 | 7.1 | 24.9 |
| Example 3 | 2 | tack-free | 64 | 11.2 | 3.4 |
| Example 4 | 7.5 | tack-free | 37 | 6.9 | 21.8 |
| Example 5 | 3.5 | tack-free | 74 | 11.0 | 7.2 |
| Comparative Experiment A | 30 | very tacky and thread-forming | 9.6 | 14.0 | 71.8 | a. Required for complete formation and adequate adhesion of a 1 cm² relief image obtained using a screen with 5% tonal value and 30 lines/cm.
b. Surface tackiness of a solid area after 10 minutes' exposure, in the absence of a polyester film during exposure.
c. Weight increase after 24 hours' storage in water ($H_2O$) and ethyglycol acetate (EGAc) respectively.

COMPARATIVE EXAMPLE B a. 254 parts of a polyurethane, which has been manufactured from isophoronediisocyanate, 1,4-butanediol monoacrylate and an adipic acid/diethylene glycol polyester having an OH number of 56, are thoroughly mixed with 60 parts of 1,4-butanediol diacrylate, 60 parts of n-butyl acrylate, 20 parts of methyl methacrylate and 6 parts of benzoin methyl ether.

b. Manufacture of printing plates

An image-bearing transparency is placed on a glass plate which transmits actinic light, and is covered with a 10 μthick film which also transmits actinic light and the film is smoothed down with a rubber wiper in order to remove occluded air bubbles. A layer of the mixture indicated above is then applied to the film and brought to a uniform thickness of about 500 μby conventional means. The layer thus applied is then irradiated for 11 seconds over its entire area from above with the actinic light from 5 fluorescent tubes of 40 W each. A steel sheet provided with a conventional adhesion-promoting layer is then applied, using a roller, to the layer which has been preexposed in this way, and this is immediately followed by image-wise exposure from below through the glass plate.

After this pre-exposure and image-wise exposure, and after removal of the film, the plate is developed using ethanol as the developer in order to remove the unexposed areas of the layer, post-exposed for 4 minutes under fluorescent tubes and aftertreated for 3 minutes at 100° C.

This gives a printing plate with a sharp relief image. Some properties of the compositions and printing plates, which are of significance for the printing trade, are listed in Table 2. It is also found that when a layer of the above composition is exposed over its entire area to fluorescent tubes at a distance of 150 mm, in the presence of air, the resulting layer has a very tacky surface even after 17 minutes' exposure.

EXAMPLE 6 a. A polyurethane (A) is manufactured by reacting from about 2.4 equivalents of a polyester (A1) obtained from adipic acid and phthalic anhydride, and 1,2-propylene glycol and a minor amount of 1,1,1-trimethylolpropane, the polyester having an OH number of 165, with about 5.5 equivalents of isophoronediisocyanate (A2) and about 3.8 equivalents of 2-hydroxyproyl acrylate (A3). 95 parts of this polyurethane (A) are thoroughly mixed with 52.5 parts of N-vinlypyrrolidone and 2.25 parts of benzoin isopropyl ether.

b. Manufacture of printing plates

It is found that the above photo-crosslinkable composition according to the invention is so photosensitive that processing by the method of Comparative Experiment B, parapgraph b), with preexposure of the entire layer, is neither appropriate nor necessary. As a result, printing plates can be manufactued in a simpler manner, namely by casting a layer of the above composition on an aluminum base provided with an adhesion-promoting layer, and the thickness of the applied layer is brought to about 500 $\mu$ by conventional means. The layer is then covered with a 10 $\mu$ thick film which transmits actinic light, and exposed image-wise in a vacuum frame through an image-bearing transparency. The relief printing plates are developed in the same way as the printing plate of Comparative Experiment B, paragraph (b). The printing plates obtained have a much clearer and sharper relief image and a much more favorable shoulder shape than the printing plates manufactured in accordance with Comparative Experiment B.

300,000 impressions of excellent quality can be obtained from the printing plates, manufactured in accordance with the invention, without loss of quality. Some properties of the compositions and printing plates, which are of significance for the printing trade, are listed in Table 2.

It is also found that, after 120 seconds' exposure of the entire surface of the layer of photocrosslinkable material of the invention to fluorescent tubes at a distance of 150 mm, in the presence of air, the resulting layer has a completely tack-free surface.

TABLE 2

Some properties of the compositions and printing plates according to Comparative Experiment B and Example 6

| Properties | Comparative experiment B | Example 6 |
|---|---|---|
| Shore D hardness | 60 | 84 |
| Ball indentation hardness (g/mm$^2$) (according to DIN 50,351) | 450 | 2,800 |
| Tensile strength (kg/cm$^2$) | 150 | 565 |
| Elongation at break (%) | 20 | 10 |
| Impact resilience (%) (according to DIN 53,512) | 50 | 47 |
| Surface tackiness | high | none |
| Pre-exposure time (sec) | 11 | 0 |
| Exposure time (in sec) for: | | |
| screen (3% tonal value) | 840 | 23 |
| screen (5% tonal value) | 660 | 12 |
| individual dot 300 $\mu$ in diameter | 840 | 20 |

We claim:

1. A fluid, photo-crosslinkable composition for use in the manufacture of a laminate and comprising a photoinitiator and a mixture of the following materials in the following proportions:

A. from 40 to 80 percent by weight of a soluble, olefinically unsaturated isocyanate group-free polyurethane which has a molecular weight of from 400 to 10,000, and which has been manufactured by reaction of A1. one or more soluble olefinically saturated polyesters having a hydroxyl number of from 100 to 300 and derived from a saturated polyhydric aliphatic alcohol of 2 to 8 carbon atoms and a saturated dicarboxylic acid of 4 to 8 carbon atoms or from a mixture thereof containing corresponding unsaturated alcohol and/or acid components in an amount such that the mixture contains at least 50 mole percent saturated aliphatic compounds with (A2) a polyisocyanate of 6 to 36 carbon atoms and (A3) a monoacrylate and/or monomethacrylate of an aliphatic diol of 2 to 10 carbon atoms, and B. from 20 to 60 percent by weight of at least one photopolymerizable $C_6$ to $C_8$ N-vinyllactam monomer or a mixture of at least 20% by weight thereof with at least one other photopolymerizable monomer.

2. A composition as claimed in claim 1 wherein the unsaturated polyurethane (A) is one which has a molecular weight of from 1000 to 5000.

3. A composition as claimed in claim 1 wherein the unsaturated polyurethane (A) is one which has been manufactured from a polyester (A1) having a molecular weight of from 500 to 3000.

4. A composition as claimed in claim 1 wherein the unsaturated polyurethane (A) is one which has been manufactured from a soluble olefinically saturated polyester (A1) having a molecular weight of from 500 to 5,000 and obtained from a polyhydric alcohol and either adipic acid or a mixture thereof with phthalic acid or phthalic anhydride.

5. A composition as claimed in claim 1 wherein the N-vinyl lactam is N-vinyl-pyrrolidone.

6. A composition as claimed in claim 1 wherin the monomer mixture contains more than 50% by weight of one or more $C_6$ to $C_8$ N-vinyllactams.

7. A relief printing plate obtained from a laminate comprising a substrate and a layer of a photo-crosslinkable composition consisting essentially of a photoinitiator and a mixture of the following materials in the following proportions:

A. from 40 to 80 percent by weight of a soluble, olefinically unsaturated isocyanate group-free polyurethane which has a molecular weight of from 400 to 10,000, and which has been manufactured by reaction of A1. one or more soluble olefinically saturated polyesters having a hydroxyl number of from 100 to 300 and derived from a saturated polyhydric aliphatic alcohol of 2 to 8 carbon atoms and a saturated dicarboxylic acid of 4 to 8 carbon atoms or from a mixture thereof containing corresponding unsaturated alcohol and/or acid components in an amount such that the mixture contains at least 50 mole percent saturated aliphatic compounds with (A2) a polyisocyanate of 6 to 36 carbon atoms and (A3) a monoacrylate and/or monomethyacrylate of an aliphatic diol of 2 to 10 carbon atoms, and B. from 20 to 60 percent by weight of at least one photopolymerizable $C_6$ to $C_8$ N-vinyllactam monomer or a mixture of at least 20% by weight thereof with at least one other photopolymerizable monomer, by image-wise exposure of said layer to actinic light and thereafter effecting removal of the material from the unexposed areas of said layer.

8. A process for the production of relief printing plates by image-wise exposing to actinic light the photocrosslinkable layer of a laminate comprising a substrate and a photo-crosslinkable layer of a composition consisting essentially of a photoinitiator and a mixture of the following materials in the following proportions:
   A. from 40 to 80 percent by weight of a soluble, olefinically unsaturated isocyanate group-free polyurethane which has a molecular weight of from 400 to 10,000, and which has been manufactured by reaction of
   A1. one or more soluble olefinically saturated polyesters having a hydroxyl number of from 100 to 300 and derived from a saturated polyhydric aliphatic alcohol of 2 to 8 carbon atoms and a saturated dicarboxylic acid of 4 to 8 carbon atoms or from a mixture thereof containing corresponding unsaturated alcohol and/or acid components in an amount such that the mixture contains at least 50 mole percent saturated aliphatic compounds with
   (A2) a polyisocyanate of 6 to 36 carbon atoms and
   (A3) a monoacrylate and/or monomethyacrylate of an aliphatic diol of 2 to 10 carbon atoms, and
   B. from 20 to 60 percent by weight of at least one photopolymerizable $C_6$ to $C_8$ N-vinyllactam monomer or a mixture of at least 20% by weight thereof with at least one other photopolymerizable monomer, and thereafter removing the material from the unexposed areas of said layer.

* * * * *